US011176507B2

(12) United States Patent
Alifantis et al.

(10) Patent No.: US 11,176,507 B2
(45) Date of Patent: Nov. 16, 2021

(54) RECONFIGURABLE PREDICTIVE AND SIMULATIVE DIGITAL PLATFORM FOR MULTI-STAGE PROCESSING FACILITIES

(71) Applicant: Accenture Global Solutions Limited, Dublin (IE)

(72) Inventors: Thanos Alifantis, London (GB); Shereen Ashraf, Greenford (GB); Rohit Banerji, Brighton (GB); William Richard Gatehouse, West Sussex (GB); Yassine Houari, London (GB); Loizos Markides, London (GB); Marius Meger, Munich (DE); Jan Andre Nicholls, Walton-on-Thames (GB); Giorgio Michele Scolozzi, London (GB); Jurgen Weichenberger, Surrey (GB)

(73) Assignee: Accenture Global Solutions Limited, Dublin (IE)

(*) Notice: Subject to any disclaimer, the term of this patent is extended or adjusted under 35 U.S.C. 154(b) by 351 days.

(21) Appl. No.: 15/971,805

(22) Filed: May 4, 2018

(65) Prior Publication Data
US 2019/0340558 A1 Nov. 7, 2019

(51) Int. Cl.
  *G06Q 10/06* (2012.01)
  *G06N 20/00* (2019.01)
  (Continued)

(52) U.S. Cl.
  CPC ... *G06Q 10/06375* (2013.01); *G06F 3/04842* (2013.01); *G06F 30/20* (2020.01); *G06N 20/00* (2019.01); *G06Q 10/06393* (2013.01)

(58) Field of Classification Search
  CPC .......... G06Q 10/06375; G06Q 10/0635; H04L 41/0645; H04L 41/0681; H04L 41/0853;
  (Continued)

(56) References Cited

U.S. PATENT DOCUMENTS 5,826,065 A * 10/1998 Hinsberg, III ......... G05B 17/02
  717/104
5,852,449 A * 12/1998 Esslinger ................ G06F 30/20
  345/473

(Continued)

FOREIGN PATENT DOCUMENTS

EP    2045673 A2    4/2009

OTHER PUBLICATIONS

Extended European Search Report in Europe Application No. 19172140.6, dated Oct. 8, 2019, 8 pages.

(Continued)

*Primary Examiner* — Johnna R Loftis
(74) *Attorney, Agent, or Firm* — Crowell & Moring LLP

(57) ABSTRACT

This disclosure relates to a reconfigurable simulative and predictive digital assistant/platform for simulation of a multi-stage processing facility. The digital assistant generates and assembles digital representations of the individual physical processing stages and components of the multi-stage processing facility in a reconfigurable manner according to a set of configuration commands generated using user inputs in a graphical user interface. At least one of the digital representations include a reusable predictive model that is trained when the digital representation is generated by the digital assistant. The digital assistant further performs simulation of the multi-state processing facility "as is" or in alternative "what-if" scenarios by simulating the digital representations according to a set of timing signals in the set of configuration commands.

19 Claims, 15 Drawing Sheets

(51) Int. Cl.
*G06F 3/0484* (2013.01)
*G06F 30/20* (2020.01)

(58) Field of Classification Search
CPC ......... H04L 41/12; G06F 30/20; G06F 16/27; G05B 19/41885
See application file for complete search history.

(56) References Cited

U.S. PATENT DOCUMENTS

| | | | | |
|---|---|---|---|---|
| 2007/0078533 | A1* | 4/2007 | Caldwell | G05B 13/04 700/37 |
| 2009/0089030 | A1 | 4/2009 | Sturrock et al. | |
| 2013/0290512 | A1* | 10/2013 | Ngoo | H04L 41/0853 709/224 |
| 2017/0102693 | A1 | 4/2017 | Kidd et al. | |
| 2018/0130260 | A1* | 5/2018 | Schmirler | G06Q 10/0633 |
| 2018/0131907 | A1* | 5/2018 | Schmirler | H04N 5/23238 |
| 2018/0196409 | A1* | 7/2018 | Ben-Bassat | G06Q 10/0833 |
| 2018/0210436 | A1* | 7/2018 | Burd | G06F 30/20 |
| 2018/0267496 | A1* | 9/2018 | Wang et al. | G05B 19/056 345/633 |
| 2018/0274961 | A1* | 9/2018 | Miller | G01F 5/005 73/170.01 |
| 2018/0331937 | A1* | 11/2018 | Sterzbach | H04L 41/145 |
| 2019/0137982 | A1* | 5/2019 | De | G05B 19/41845 |
| 2019/0163147 | A1* | 5/2019 | D'Amato | G06F 8/35 |
| 2019/0163215 | A1* | 5/2019 | Cheng | G06Q 50/06 |
| 2020/0050181 | A1* | 2/2020 | McDaniel | G05B 17/02 |

OTHER PUBLICATIONS

Robinson et al., "Knowledge-based improvement: simulation and artificial intelligence for identifying and improving human decision-making in an operations system" Journal of the Operational Research Society, (2005) vol. 56, No. 8, pp. 912-921, published online Dec. 1, 2004.

GE Digital Twin Analytic Engine for the Digital Power Plant, GE Power Digital Solutions, 2016, 30 pages, obtained from the Internet at URL: <https://www.ge.com/digital/sites/default/files/Digital-Twin-for-the-digital-power-plant-.pdf> on Jun. 13, 2018.

Accenture Labs, Delivering Improved Insights with Automated Analytics, Model management framework simplifies model deployment at scale, 2016, 12 pages, obtained from the Internet at URL: <https://www.accenture.com/t00010101T000000Z_w_/gb-en/_acnmedia/PDF-28/Accenture-Delivering-Improved-Insights-Automated-Analytics.pdf> on Jun. 13, 2018.

Office Action issued on European application 19172140.6 dated Apr. 28, 2021, 7 pages.

* cited by examiner

| attribute | value |
|---|---|
| MEAN_PH_VALUE | 9.466102 |
| MEAN_PSD_VALUE | 200 |
| MEAN_TSC_VALUE | 41.40695 |
| LATEX_TANK_OUTPUT_PH_QUALITY | 0 |
| TARGET_LATEX_QUALITY_VARIATION | 0.1 |
| MAXIMUM_WAITING_TIME | 5 |
| STIRRING_IMPOVEMENT_FACTOR | 1 |
| STIRRING_IMPOVEMENT_FACTOR_STE | 0.1 |
| SIM_TIME | 2000 |
| ENABLE_LATEX_INTERVENTION | TRUE |
| signal | "latex_tank_output_ok" | global variables

Figure 11

RECONFIGURABLE PREDICTIVE AND SIMULATIVE DIGITAL PLATFORM FOR MULTI-STAGE PROCESSING FACILITIES

TECHNICAL FIELD

This disclosure relates to a reconfigurable analytical digital platform for simulating, predicting, and controlling multi-stage processing facilities.

BACKGROUND

Analytical techniques in the field of data science may be employed to develop computer simulations for equipment and processing components deployed in various industrial operations, such as multi-stage processing facilities or plants. In one aspect, the development and use of these simulations have required over-simplification of the representation of the logic of individual components (system entities). In another aspect, these simulations may be specifically developed/optimized for individual processing components of a large number of interconnecting/interacting processing components of a complex industrial operation. Such an approach thus does not offer a holistic simulative and predictive system level digital platform including analytical components that may be easily adapted and reconfigured to simulate, predict, and control multi-stage processing facilities without requiring heavy data analytic and computer skills.

BRIEF DESCRIPTION OF THE DRAWINGS

FIG. 11 illustrates an example configuration of global variables for a digital replica or digital sibling of a multi-stage processing facility.

DETAILED DESCRIPTION

Figure 1:
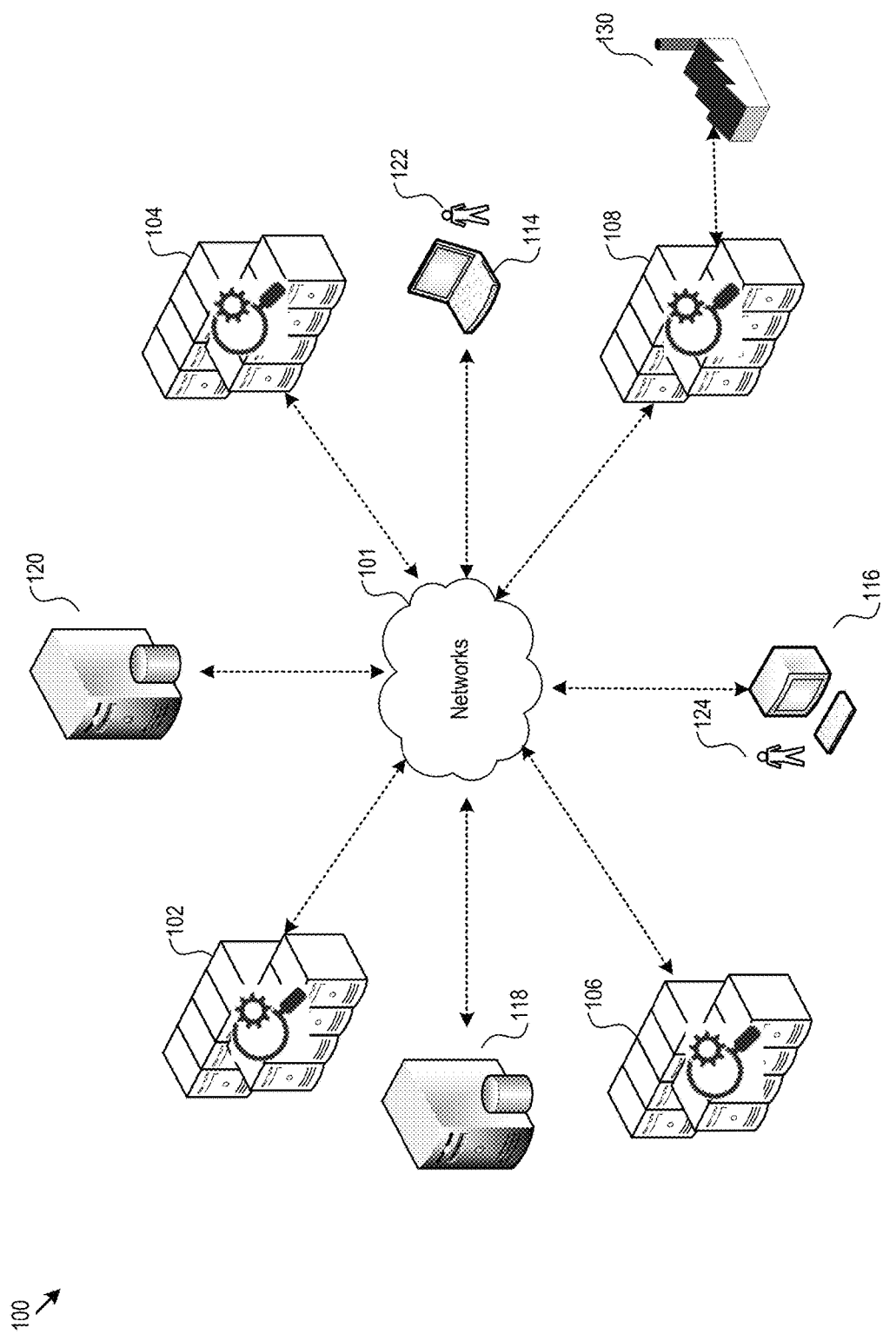
FIG. 1 shows an exemplary electronic system for implementing a predictive and simulative digital platform for a multi-stage processing facility.

A reconfigurable Discrete Event Simulation and predictive digital platform, herein also referred to as a reconfigurable digital platform, digital platform, digital assistant, or reconfigurable digital assistant, is described in detail in the disclosure below. While some examples may be provided in a setting of a plant for production of chemicals, the underlying principles of the disclosure are applicable to other industrial contexts involving multiple interconnected and interacting processing components and stages.

In particular, the reconfigurable digital platform may include various computing and networking components in communication with a multi-stage processing facility and may be designed for building and interconnecting digital representations of physical equipment and processing components at various processing stages of the multi-stage processing facility into a digital replica of the multi-stage processing facility. The digital replica may be configured to simulate the operation of the multi-stage processing facility and predict a set of key performance indicators, either in real-time and in synchronization with the actual operation of the multi-stage processing facility or offline. The digital platform further provides flexibility in reconfigurably building a digital sibling, i.e., a computer simulation, of the multi-stage processing facility including variations to the interconnection between processing units, components and equipment and/or variations to operating parameters of the operating units, components and equipment. As such, "what-if" scenarios may be simulated and predicted by an appropriately configured digital sibling of the multi-stage processing facility, providing valuable insight into the operators of the multi-stage processing facility and guidelines for improving the configuration and operation of the actual facility in terms of key performance indicators.

The digital platform disclosed below is reconfigurable because it uses reusable models for building a digital representation for each individual processing components. It provides a platform for systematically and adaptively configure the interconnection and signaling between each digital representation. The digital platform further provides various user graphic interface for establishing and interconnecting these digital representations.

In one embodiment, the digital platform includes a digital assistant (or a method for implementing a digital assistant) for a multi-stage processing facility, which includes a communication interface circuitry for receiving real-time data from the multi-stage processing facility, a database for storing historical data of the multi-stage processing facility, a model repository for storing at least one predictive model training code, a configuration memory for storing a first group of configuration commands and a processing circuitry in communication with the database, the model repository, and the configuration memory. The processing circuitry is configured to generate a set of executable digital representations each corresponding to one of multiple physical stages of the multi-stage processing facility by interpreting a first set of commands of the first group of configuration commands, wherein at least one of the set of executable digital representations comprises a predictive model trained using a predictive model training code from the model repository and the historical data. The processing circuitry is further configured to retrieve a second set of commands from the first group of configuration commands specifying a connection topology of the set of executable digital representations that digitally replicates the multi-stage processing facility, retrieve a third set of commands from the first group of configuration commands that further specify a flow of batches of materials through the set of executable digital representations, retrieve a fourth set of commands from the first group of configuration commands in the configuration memory that specify inter-digital-representation triggering or linking signals, and then load and execute the set of executable digital representations in a time sequence according to the flow of batches of materials through the connection topology of the set of executable digital representations and according to the inter-digital-representation triggering or linking signals. The processing circuitry is also configured to generate a graphic display of a predicted key performance indicator output from the execution of the set of executable digital representations. The processing circuitry may also be configured to receive the real-time data from the multi-stage processing facility via the communication interface circuitry and storing the real-time data as part of the historical data in the database.

In one embodiment, the processing circuitry above is further configured to provide a graphical user interface for uploading the at least one predictive model training code; and store the at least one predictive model training code in the model repository. In another embodiment, the real-time data and historical data include measurement data taken by sensors distributed in the multi-stage processing facility. In another embodiment, at least two of the set of executable digital representations comprise a predictive model trained based on identical predictive model training code. In another embodiment, the processing circuitry above is further configured to provide a graphical user interface including a first graphical user interface component for obtaining a selection of attributes for establishing a library of executable digital representations and a second graphical user interface component for graphically obtaining a first selection and a first arrangement of the set of executable digital representations from the library of executable digital representations; generate the first group of configuration commands according to the selection and the first arrangement of the set of executable digital representations in the second graphical user interface component and the selection of attributes in the first graphical user interface component; and store the first group of configuration commands in the configuration memory. In another embodiment, the processing circuitry above is further configured to provide a third graphical user interface component for graphically obtaining a second arrangement of the set of executable digital representations; generate a second group of configuration commands according at least the second arrangement of the set of executable digital representations; and provide a selectable option in the graphical user interface to execute the set of executable digital representations by interpreting either the first group of configuration commands or the second group of configuration commands. In another embodiment, the second set of commands from the first group of configuration commands further specify real-time data or triggering signal communicated from the multi-stage processing facility to the set of executable digital representations, and wherein the processing circuitry above is configured to load and execute the set of executable digital representations in the time sequence according to the real-time data or triggering signal communicated from the multi-stage processing facility in addition to according to the flow of batches of materials through the connection topology of the set of executable digital representations and according to the inter-digital-representation triggering or linking signals. In another embodiment, the real-time data or triggering signal communicated from the multi-stage processing facility are generated by sensors distributed in the multi-stage processing facility. In another embodiment, the processing circuitry above is configured to receive the real-time data or triggering signal from the multi-stage processing facility using a predetermined communication message protocol. In another embodiment, at least one of the inter-digital-representation triggering or linking signals include a predicted characteristics of a batch of materials generated by one digital representation and inputted to a next digital representation connected according to the connection topology. In another embodiment, the processing circuitry above is further configured to communicate control messages generated based on the predicted key performance indicator to the multi-stage processing facility using a predetermined communication protocol. In another embodiment, the first group of configuration commands are organized as a plurality of spreadsheets in text format. In another embodiment, the set of executable digital representations includes predictive digital representations and non-predictive digital representations. In yet another embodiment, each of the set of executable digital representations comprises at least one log function specified in the first set of commands of the first group of configuration commands for generating timestamped log messages when executed, and wherein the processing circuitry is further configured to provide a log display panel for tracking activities of the set of executable digital representations being executed by displaying the timestamped log messages Referring now to the drawings, FIG. 1 shows an exemplary reconfigurable simulative and predictive digital platform 100 for a multi-stage processing platform 130. The reconfigurable digital platform may include one or more platform servers 102, 104, and 106, one or more databases 120, one or more data repositories 118, and user devices 114 and 116 associated with users 122 and 124. These components of the digital platform 100 are inter-connected and in communication with one another via public or private communication networks 101. The reconfigurable digital platform 100 may be in communication with plant servers 108 of the multi-stage processing facility 130 using the communication networks 101.

The platform servers 102, 104, and 106 may be implemented as a central server or a plurality of servers distributed in the communication networks. Likewise, the plant servers 108 may be implemented as a central server or distribute servers. While the platform servers and plant servers are shown in FIG. 1 as implemented as separate servers, they may be alternatively combined in a single server or single group of distributed servers combining the digital platform and plant operation/computation functionalities. The user devices 114 and 116 may be of any form of mobile or fixed electronic devices including but not limited to desktop personal computer, laptop computers, tablets, mobile phones, personal digital assistants, and the like. The user devices 114 and 116 may be installed with a user interface for accessing the digital platform.

The one or more databases 120 of FIG. 1 may be hosted in a central database server or a plurality of distributed database servers. For example, the one or more databases 120 may be implemented as being hosted virtually in a cloud by a cloud service provider. The one or more databases 120 may organize data in any form, including but not limited to relational database containing data tables, graphic database containing nodes and relationships, and the like. The one or more databases 120 may be configured to store, for example, historical data collected from the multi-stage processing facility 130, including but not limited to sensor data and any other directly measured or derived data items and data sequences with or without timestamps.

The one or more data repositories 118 may be used to store, for example, digital representations of the processing components of the multi-state processing facility. The digital representation, in one implementation, may be stored in the one or more data repositories 118 in an executable form. Some of the digital representations may include other models, such as a predictive model developed based on machine learning algorithms. Such a predictive model, may also be stored in the one or more data repositories 118. Alternatively, the predictive model may be generated as needed during the simulation and codes for generating the predictive model on the play, such as training codes based on machine training algorithms, may be stored in the data repository 118. In addition, configuration information in the form of a set of configuration commands, as will be described in much detail below, may be maintained in the one or more data repository 118, in any data or file format. The one or more data repositories may be implemented as either volatile and/or non-volatile memories, and may be centralized or distributed.

Figure 2:
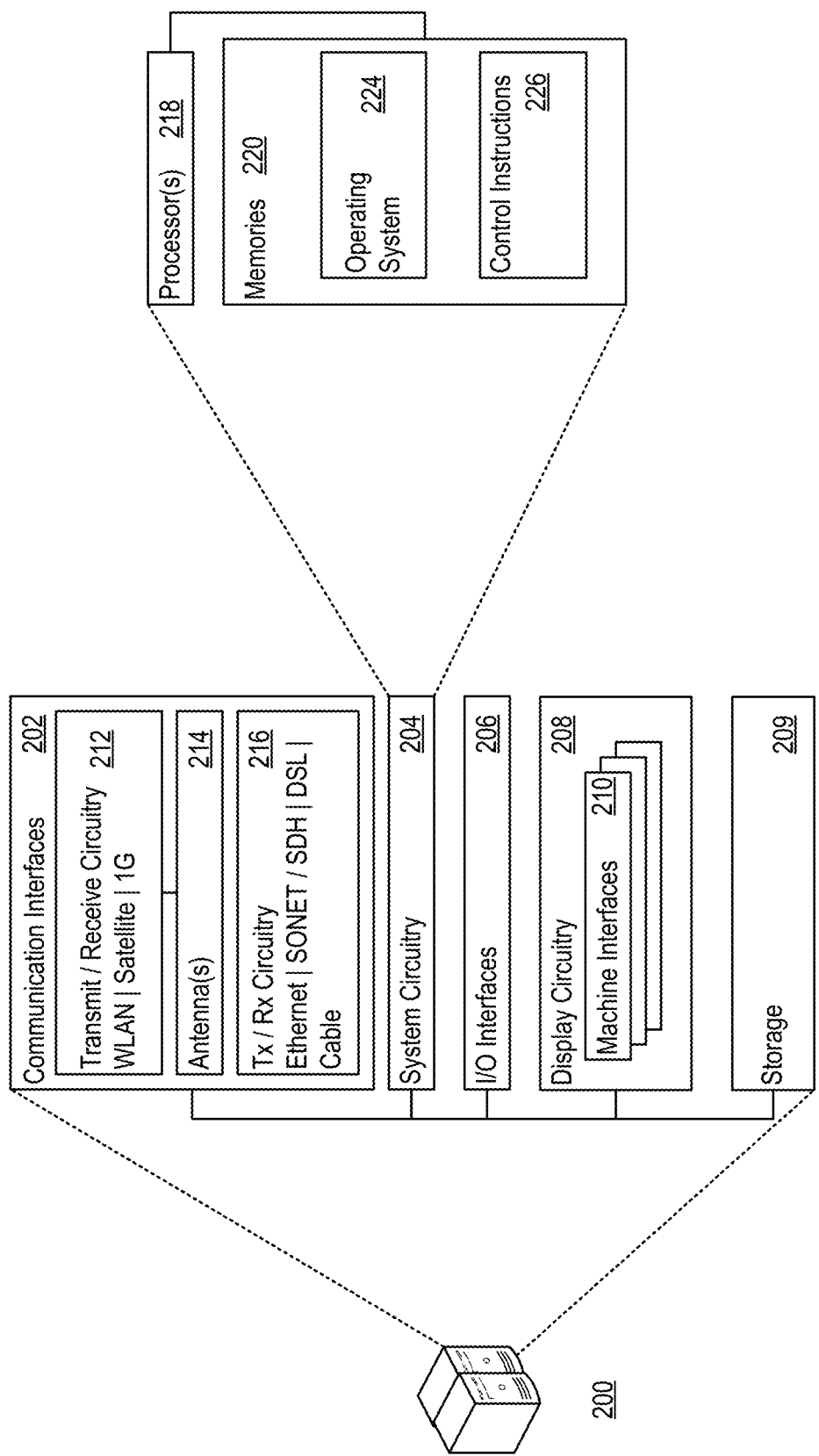
FIG. 2 illustrates a computer system that may be used to implement various components and functionalities of the predictive and simulative digital platform for a multi-stage processing facility in FIG. 1.

FIG. 2 shows an exemplary computer system 200 for implementing any of the computing components of FIG. 1. The computer system 200 may include communication interfaces 202, system circuitry 204, input/output (I/O) interfaces 206, storage 209, and display circuitry 208 that generates machine interfaces 210 locally or for remote display, e.g., in a web browser running on a local or remote machine. The machine interfaces 210 and the I/O interfaces 206 may include GUIs, touch sensitive displays, voice or facial recognition inputs, buttons, switches, speakers and other user interface elements. Additional examples of the I/O interfaces 206 include microphones, video and still image cameras, headset and microphone input/output jacks, Universal Serial Bus (USB) connectors, memory card slots, and other types of inputs. The I/O interfaces 206 may further include magnetic or optical media interfaces (e.g., a CDROM or DVD drive), serial and parallel bus interfaces, and keyboard and mouse interfaces.

The communication interfaces 202 may include wireless transmitters and receivers ("transceivers") 212 and any antennas 214 used by the transmitting and receiving circuitry of the transceivers 212. The transceivers 212 and antennas 214 may support Wi-Fi network communications, for instance, under any version of IEEE 802.11, e.g., 802.11n or 802.11ac. The communication interfaces 202 may also include wireline transceivers 216. The wireline transceivers 116 may provide physical layer interfaces for any of a wide range of communication protocols, such as any type of Ethernet, data over cable service interface specification (DOCSIS), digital subscriber line (DSL), Synchronous Optical Network (SONET), or other protocol.

The storage 209 may be used to store various initial, intermediate, or final data or model needed for the implantation of the digital platform 100. The storage 209 may be separate or integrated with the one or more databases 120 and one or more data repositories 118 of FIG. 1. The storage 209 may be centralized or distributed, and may be local or remote to the computer system 200. For example, the storage 209 may be hosted remotely by a cloud computing service provider.

The system circuitry 204 may include hardware, software, firmware, or other circuitry in any combination. The system circuitry 204 may be implemented, for example, with one or more systems on a chip (SoC), application specific integrated circuits (ASIC), microprocessors, discrete analog and digital circuits, and other circuitry. The system circuitry 204 is part of the implementation of any desired functionality related to the reconfigurable digital platform 100. As just one example, the system circuitry 204 may include one or more instruction processors 218 and memories 220. The memories 220 stores, for example, control instructions 226 and an operating system 224. In one implementation, the instruction processors 218 executes the control instructions 226 and the operating system 224 to carry out any desired functionality related to the reconfigurable digital platform 100.

Figure 3:
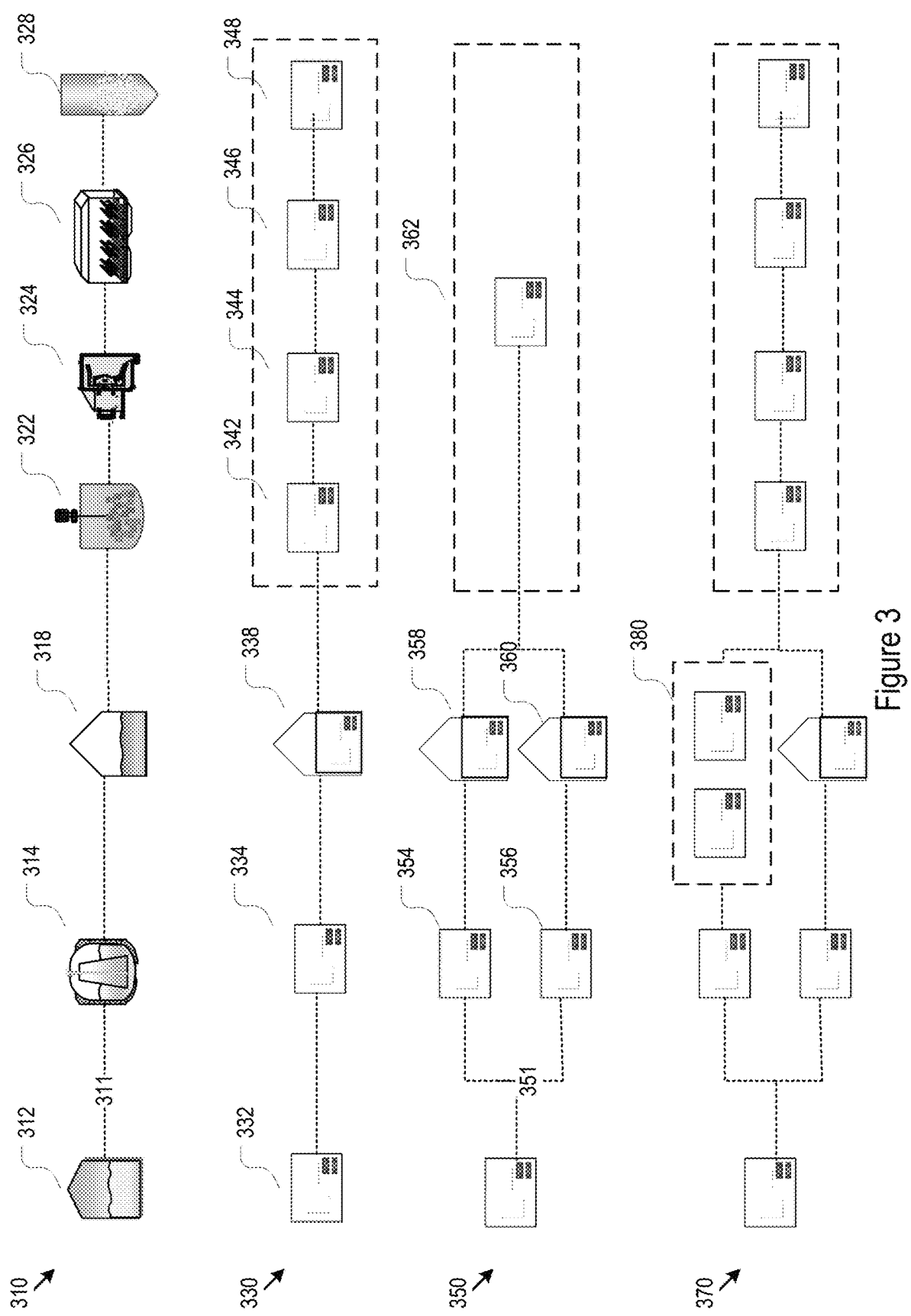
FIG. 3 illustrates a processing flow of a representative multi-stage processing facility and corresponding predictive and simulative models containing interconnected digital representations (digital agents) of various physical processing stages and components of the multi-stage processing facility.

FIG. 3 shows an example that illustrates the main functionality of the reconfigurable digital platform 100 of FIG. 1. In particular, 310 of FIG. 3 illustrates a physical arrangement of processing components and processing stages of a multi-stage processing facility, e.g., a chemical plant. The multi-stage processing facility 310 many include multiple processing stages and components. For example, the multi-stage processing facility 310 may include a raw material intake and mixing stage represented by intake tank 312, a reaction stage represented by reactors 314, a buffering stage represented by buffer tank 318, and a continuous processing stage represented by cascading processing components 322, 324, 326, and 328. A multi-stage processing facility such as the chemical plant 310 of FIG. 3 may operate entirely in batch processing mode or continuous processing mode, or alternatively, in mixed batch and continuous processing stages. The multi-stage processing facility 310, for example, may process batches of raw or intermediate materials in the input thank 312, the reactor 314, and the buffer tank 318. Intermediate materials accumulated in buffer tank 322 may further be released into the continuous processing pipeline including processing components 322-328. The release of materials between the batch processing components and from the buffer tank 322 to the first processing component 322 of the continuous processing pipeline may be configured in various ways, e.g., periodically and/or upon particular predefined operational parameters satisfying predetermined conditions.

Flow diagram 330 of FIG. 3 illustrates a digital replica of the multi-stage processing facility 310 that may be implemented by the reconfigurable digital platform 100 to simulate the operation of the multi-stage processing facility 310 and predict operating status and key performance indicators in real-time. The digital replica 330 may include various digital representations each representing one or more physical processing components of the multi-stage processing facility 310. The digital representations may be established in a one to one correspondence with the physical processing components, as shown by the digital replica 330. Alternatively, a group of physical processing components may be represented by a single digital representation, as illustrated in flow diagram 350, where the entire continuous process including components 322-328 is represented by a single digital representation 362. In some other implementation, a single physical processing component, such as the buffer tank 318, may be decomposed into multiple digital representations, as shown by the digital representations 380 in flow diagram 370 of FIG. 3.

As shown by the flow diagrams 350 and 370, the reconfigurable digital platform 100 may alternatively or additionally implement variations of the digital replica 330 of the multi-stage processing facility 310. For example, in flow diagrams 350 and 370, an additional reactor 356 and buffer tank 360 are added. In some other implementation, operating parameters of one or more processing components such as heating rates, stirring rates, and the like may be modified in the corresponding digital representations. The variations of the digital replica 330, such as the 350 and 370 of FIG. 3, may be referred to as digital siblings of the multi-stage processing facility 310. The digital platform thus provides simulative and predictive capability for variations of the configuration of the multi-stage facility, allowing "what-if" scenario to be simulated and predicted in a reconfigurable and convenient manner.

As will be discussed below, the digital representations in FIG. 3 are connected together to form a digital replica or digital siblings of the multi-stage processing facility 310. The connections, as shown by 311 and 351 as examples, may be a simple direct connection representing material release of a preceding stage and material seizure of a following stage, or may be a branch connection that forks materials into separate paths. As will be described in more detail below, the reconfigurable digital platform 100 provides mechanisms for appropriately configuring and representing these and other various types of connections between digital representations.

Figure 4:
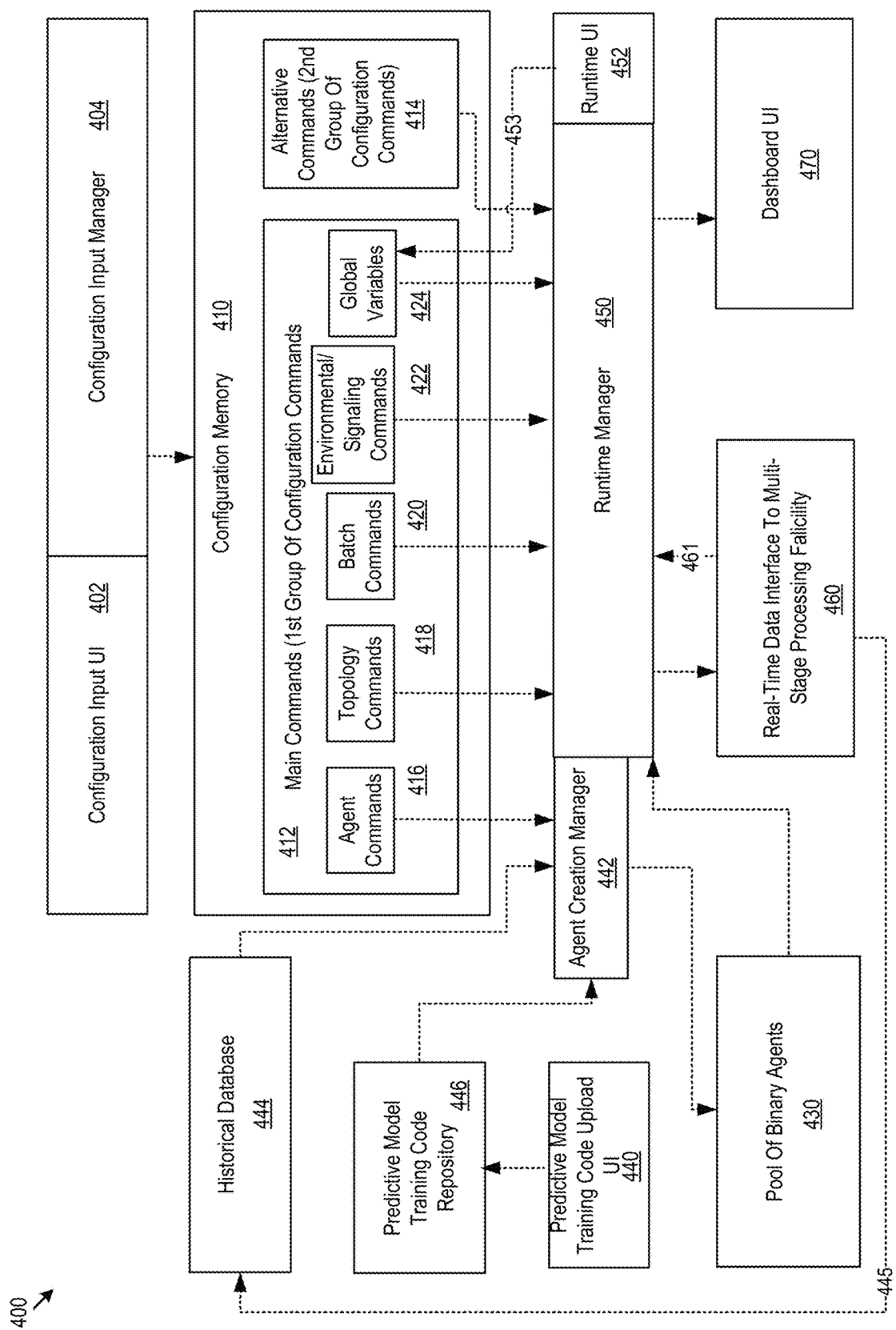
FIG. 4 illustrates functional and data flow for a simulative and predictive digital platform of FIG. 1.

FIG. 4 shows a data flow 400 of the reconfigurable digital platform 100 of FIG. 1 and a computational architecture 400 containing various processing elements for implementing the digital replica and/or digital siblings of the multi-stage processing facility in FIG. 3. The term "digital platform" will be used below to also refer to the data flow and computational architecture 400, in addition to the hardware digital platform 100 of FIG. 1.

The digital platform 400 may include an agent creation manager 442 for generating digital representations of various processing components of the multi-stage processing facility. The digital platform 400 may further include a runtime manager 450 and provide corresponding runtime user interface 452 for configuring and controlling execution of the digital representations (the term "digital representations" may be alternatively referred to as "digital agents" or "agents" below). Other components that may be implemented by the digital platform may include but are not limited to a predictive model training code upload user interface 440, a historical database 444, a repository 446 for storing training codes for predictive models, a configuration input manager 404 and a corresponding configuration input user interface 402, a configuration memory 410, a pool of binary agents 430, a real-time data interface 460 for communicating with the multi-stage processing facility, and a dashboard user interface 470 for displaying and tracking the simulation and prediction.

In one implementation, the predictive model training code upload user interface 440 may be in communication the predictive model training code repository 446. The predictive model training code upload user interface 440 may be used for inputting or uploading training code for predictive models into the predictive model training code repository 446. These training code may, for example, be written in R language. The predictive models may be trained using machine learning techniques and algorithms based on historical data corpus in the historical database 444. The training code, for example, may be prepared and uploaded by data scientists and domain experts. The user interface 440 may further provide functions for editing, constructing, and testing constructing these training codes in addition to simple uploading function.

The digital platform 400 may include the configuration input manager 404 and the corresponding configuration input user interface 402 for inputting parameters for configuring digital representations, their inter-connections/topology, and for a runtime environments. The configuration input user interface 402 may be implemented as a series of user interfaces for setting up various groups of configuration parameters. The configuration input manager 404 may process inputs received from the configuration input user interface 402 into a first (main) group of configuration commands 412 and optionally a second (alternative) group of configuration commands 414, and store these commands in the configuration memory 410. The first group of configuration commands 412 may include configuration commands that may be used by the runtime manager 450 to configure and set up the execution of the digital replica of the multi-stage processing facility. The second group of configuration commands 414 may include configuration commands that may be used by the runtime manager 450 to set up the execution of a digital sibling of the multi-stage processing facility. Multiple digital siblings may be set up via the configuration input user interface 402 and the configuration input manager 404. Correspondingly, additional groups of configuration commands may be further generated and stored in the configuration memory 410.

Each group of configuration commands 412 and 414 may be organized as subsets of configuration commands. For example, as shown in FIG. 4, the first group of configuration commands 412 may include five subsets of configuration commands 416, 418, 420, 422, and 424. The first subset of commands 416, referred to as agent command, include configuration commands for setting up each individual agent or digital representation. The second subset of commands 418, referred to as topology commands, include configuration commands for setting up inter-connections between the digital representations or agents. The third subset of commands 420, referred to as batch commands, include configuration commands for setting up, for example, a number of batches of material and the timing for their entries into the multi-stage processing facility. The fourth subset of commands 422, referred to as environmental/signaling commands, include configuration commands for controlling a runtime environment, a timing and triggering signals between executions of the connected digital representations. The fifth subset of commands 424, referred to as global variables, include configuration commands for defining global variables common all digital representations.

The agent creation manager 442 of the digital platform 400 may be used to create executable binary digital agents and store these binary agents in the pool of binary agents 430. In one particular implementation, the agent creation manager 442 may retrieve agent commands 416 for each digital agent and interpret the agent commands to create executable binary code for each digital agent and store each digital agent in the pool 430.

Digital agents created by the manager 442 may be referred to as agent behavior models and represent the behavior and logic of each entity of the multi-stage processing facility. These agent behavior models may include predictive models, prescriptive models, optimization models and rule-base models. Any type of models may be selected for a particular processing component of the multi-stage facility according to the nature of the processing component. For example, while digital agents for some processing components may be non-predictive, agents for some other processing components may provide predictive functions. For example, the digital representation 334 for the reactor 314 in FIG. 3 may be predictive in that it may simulate and predict various characteristic parameters of the materials within the reactor, such as PH values, Particle Size Distribution (PSD), and Tri-Solid Content (TSC). Such a predictive digital representation or digital agent may thus include one or more predictive analytical models. As such, the agent creation manager 442 of the digital platform 400, when creating executable predictive digital agents, may retrieve agent commands 416 for each digital agent, interpret the agent commands, retrieve historical data corpus from the historical database 444 and training codes from the predictive model training code repository 446 according to the interpreted agent command, run the training code, create executable binary code for the predictive digital agents, and store the predictive digital agents in the pool 430.

The runtime manager 450 of the digital platform 400 may be used to control the simulation and prediction for the multi-stage processing facility. For example, the runtime manager 450 may retrieve the topology commands 418 to determine the digital agents involved in the simulation and prediction and their topology. The runtime manager 450 may further retrieve the batch commands 420 to determine the material batch configuration for the simulation/prediction. The runtime manager 450 may further retrieve the signaling commands 422 for controlling the timing of execution of the digital agents and retrieve the global variables 424 for setting global execution parameters. The runtime manager 450 thus controls the retrieval of appropriate executable digital agents from the pool 430 for execution according to the topology commands and a runtime environment determined by the signaling commands, and the batch commands.

In one implementation, the agent creation manager 442, the runtime manager 450, the configuration input manager 404, and the various user interface components 4402, 440, 452, and 470 may control the creation, configuration, execution of digital agents using API calls. In particular, an exemplary implementation based on API that may be used for establishing predictive models based on, e.g., machine learning techniques, is described in the pending U.S. Patent Application No. 2017/0178020, the entirely of which is herein incorporated by reference.

FIGS. 5-8 illustrate exemplary implementations of the configuration input user interface 402 and the runtime user interface 452 of FIG. 4 as a series of user interfaces that may be navigated by a user of the digital platform for setting up and running the digital replica and/or digital siblings of the multi-stage processing facility. In one implementation, a user may be provided with a user account and additional login interface for accessing the digital platform 400. Such a series of user interfaces may be accessed locally or remotely by users of the digital platform 400 using client devices 114 and 116 of FIG. 1.

Figure 5:
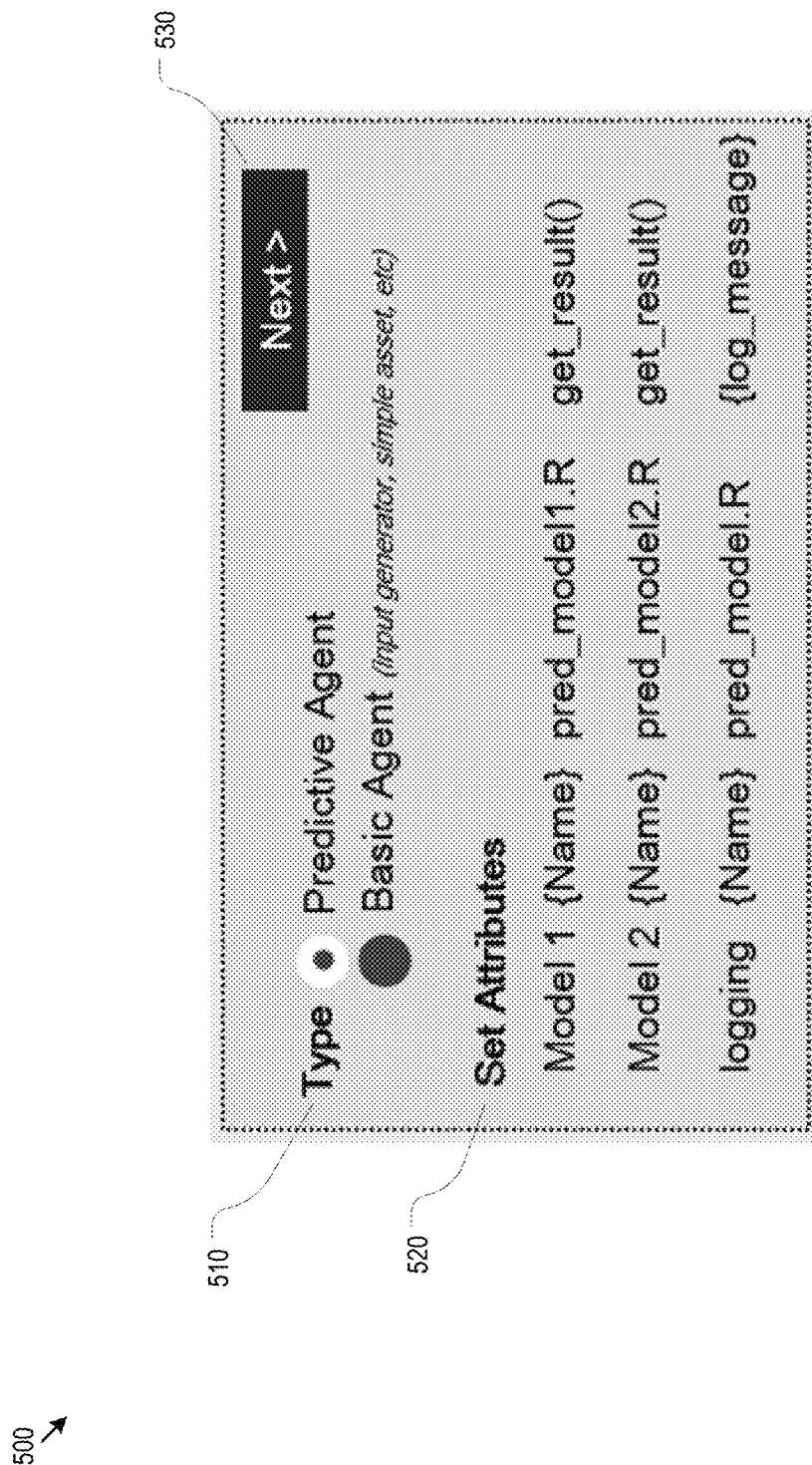
FIG. 5 illustrates an example graphical user interface for creating and configuring a digital agent.

For example, the graphical user interface 500 of FIG. 5 may be implemented as part of the configuration input user interface 402 for inputting configuration information for digital agents. The user interface 500 may provide, for example, selection of type of agent (e.g., either predictive, prescriptive, rule-based, optimization, or other non-predictive types)) via the radio button 510. In the case that the a predictive agent type is selected, the user interface 500 may further allow the user to select training codes from the repository 446 for training and obtaining predictive models needed for establishing the desired predictive agent, as shown by 520 of FIG. 5. The parameters in 520 ending with ".R", for example, refer to training codes in R language uploaded using the predictive model training code upload user interface 440 of FIG. 4. The user interface 500 may provide further options or selections of parameters for creating predictive and non-predictive agents or digital representations of the processing components of the multi-stage processing facility. These options or selections may be navigated using user interface buttons such as 530 of FIG. 5.

Figure 9:
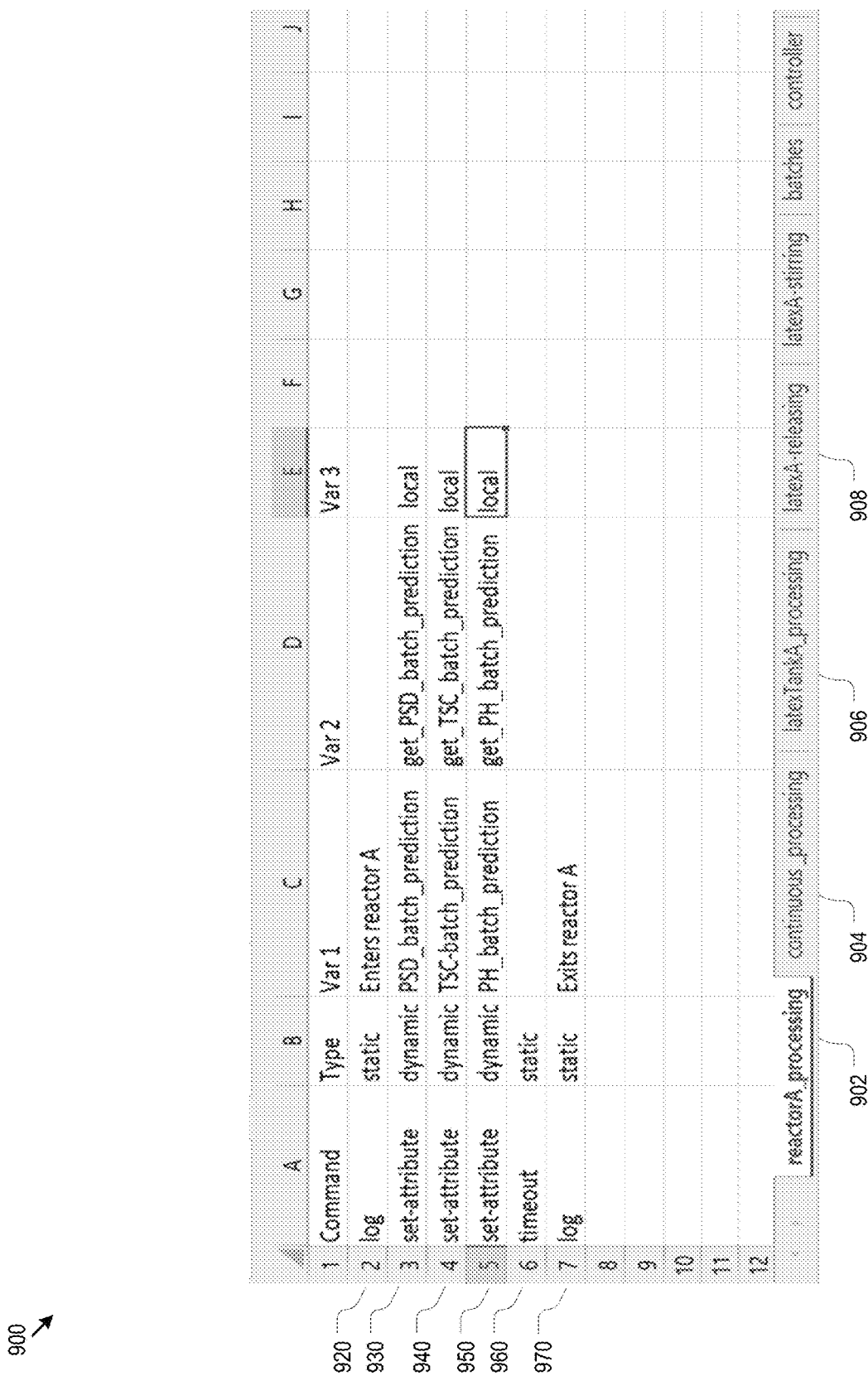
FIG. 9 illustrates an example configuration commands for a predictive digital agent.

The information and parameters inputted from the user interface 500 of FIG. 5 may be processed by the configuration input manager 404 to create the agent commands 416. Each digital agent configured using the user interface 500 may corresponds to a set of agent commands. FIG. 9 illustrates a set of agent commands 900 for an exemplary predictive digital agent 902 extracted by the configuration input manager 404 from the user interface 500. The commands in 900 of FIG. 9 are used by the runtime manager 450 to configure the digital agent. For example, commands 930, 940, and 950 specifies predictive modes to be trained and used for this predictive digital agent. Function of the other commands in 900, such as 920, 960, and 970 will be explained in more detail later in this disclosure. As shown by 904, 906, and 908 of FIG. 9, other digital agents, predictive or non-predictive, may be similarly configured using the interface 500 of FIG. 5 and extracted into sets of agent comments. The sets of commands for different digital agents may be organized by the configuration input manager 404 as spreadsheets, one for each digital agent, as shown by the various tabs 902-908 in FIG. 9.

Figure 6:
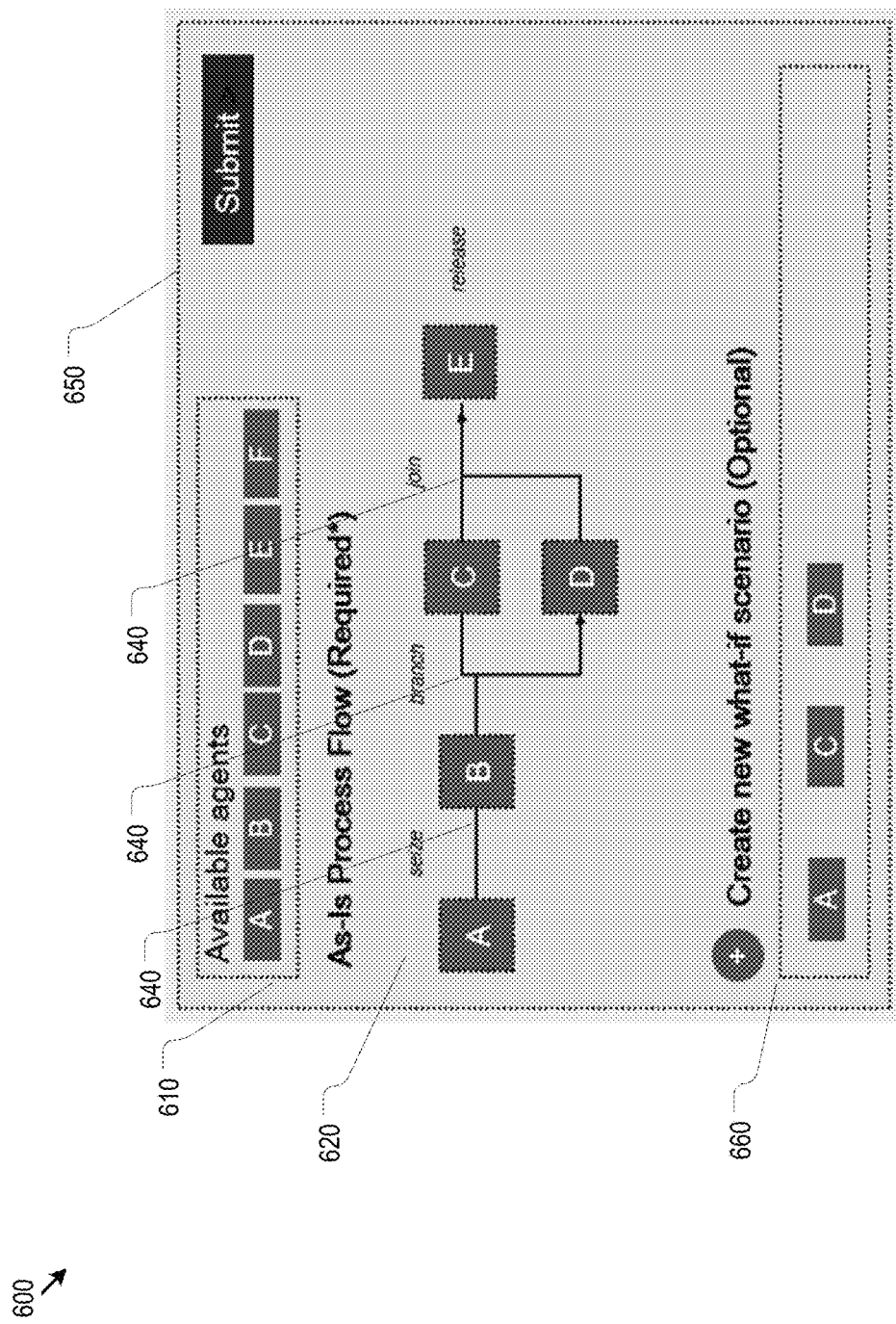
FIG. 6 illustrates an example graphical user interface for configuring interconnection of digital agents into a digital replica or digital sibling of a multi-stage processing facility.

FIG. 6 illustrates an example of another user interface 600 as part of the configuration input user interface 402 of FIG. 4 for selecting digital agents and for configuring the inter-connection topology of the selected digital agents. In one implementation, user interface 600 may include user interface component 610 for graphically showing digital agents that are created and stored in the pool 430 of FIG. 4 and are available for selection in building a digital replica or sibling of the multi-stage processing facility. The user interface 600 may further include user interface component 620 for selecting and assembling the digital agents available the user interface 610 to configure inter-connection between the selected digital agents into a topology suitable as a digital replica of the multi-stage processing facility. The selection of digital agents from the list of 610 may preferably be implemented graphically by drag and drop. The connection between the selected digital agents, e.g., 640, may be specified in any suitable way. For example, the user interface may be configured to further provide graphical capability for defining and inserting various types of straight or branch connectors. Various parameters may be defined for the connectors. For example, branching ratio of downstream materials may be specified for branch connectors. The user interface 600 may further include user interface component 660 for graphically configuring digital siblings of the multi-stage processing facility. The configuration of a digital sibling in the user interface component 660 may be similar to the configuration of the digital replica in user interface component 620, e.g., digital agents may be dragged from the list of 610 and dropped in the user interface component 660 and their connections into a digital sibling may be graphically configured.

Figure 10:
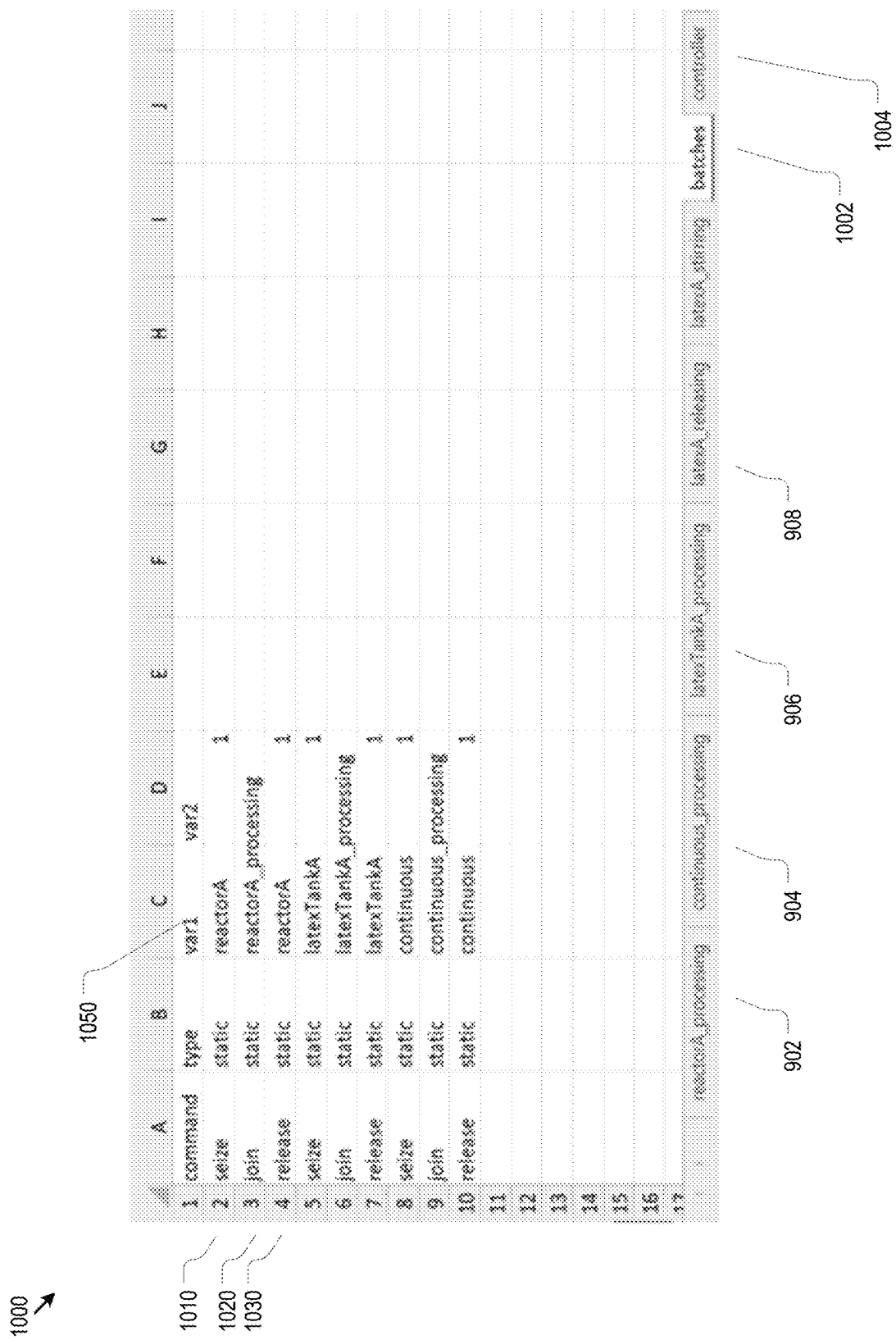
FIG. 10 illustrates an example configuration commands for configuring a simulative and predictive process agent that defines a topology of a digital replica or digital sibling of a multi-stage processing facility.

Multiple instances of a same digital agent in the list 610 may be dragged and dropped into the digital replica or digital sibling of the multi-stage processing facility. For example, the digital sibling 350 of FIG. 3 of the multi-stage processing facility 310 contains two digital representations 354 and 356 representing two reactors. They may be based on selecting the same digital reactor agent twice in the agent list 610 of FIG. 7 into the digital sibling configuration interface component 660. The selection of digital agents and their topology via the user interface 600 may be further processed and extracted by the configuration input manager 404 into the topology commands 418 of FIG. 4. For example, FIG. 10 shows exemplary topology commands 1000 as part of a batch process agent 1002. The commands 1010, 1020, and 1030, as will be described in more detail below, use other predictive and non-predictive agents as parameters as indicated by 1050, and thus specify the inter-connections and topology between the various digital representations.

Figure 7:
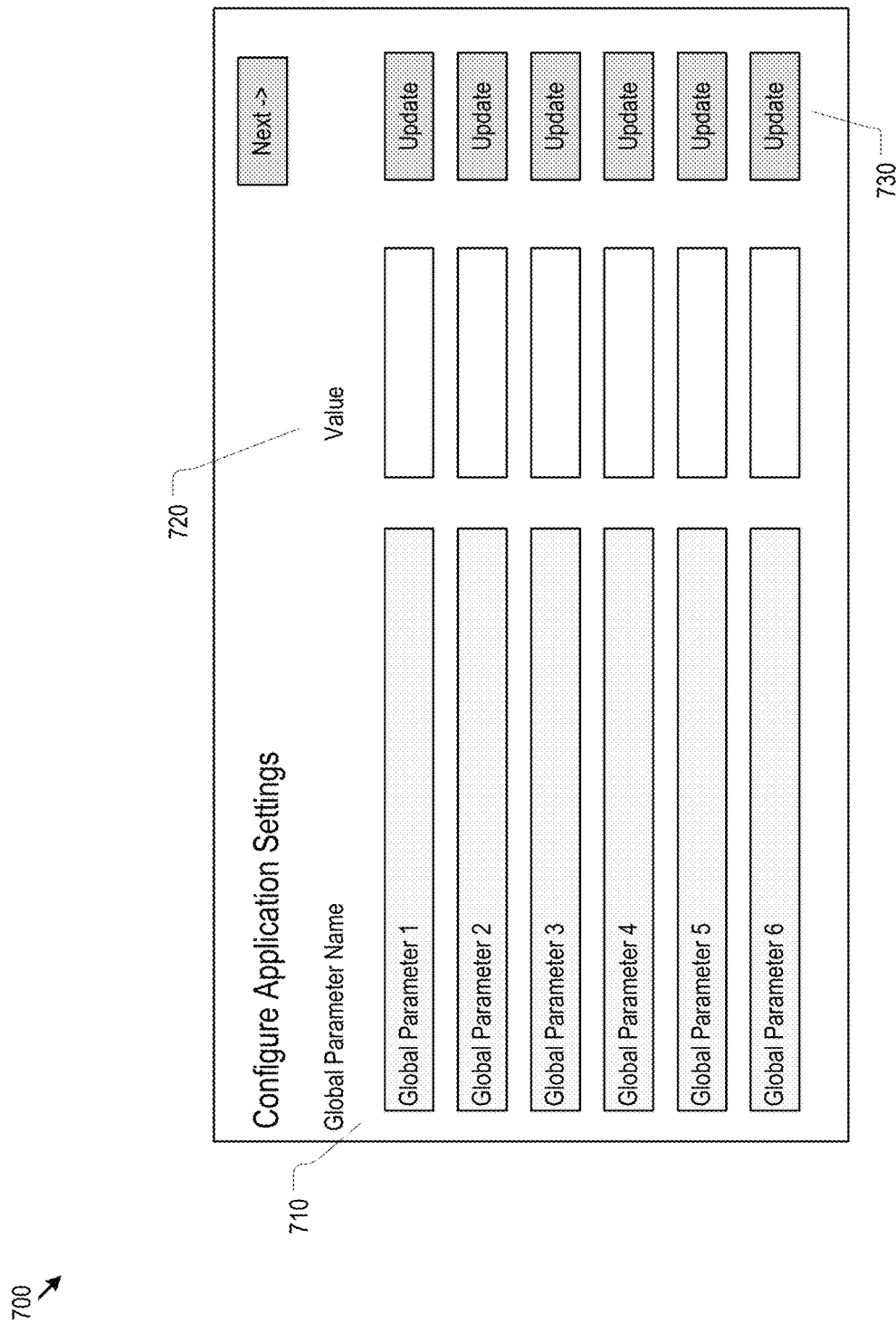
FIG. 7 illustrates an example graphical user interface for configuring global variables for a digital replica or digital sibling of a multi-stage processing facility.

FIG. 7 illustrates an example of another user interface 700 as part of the configuration input user interface 402 of FIG. 4 for specifying global parameters used for the digital replica or digital siblings of the multi-stage processing facility. The user may specify the global parameters 710, change their values 720, and update (730) the global variables. These global parameters may then be extracted by the configuration input manager 404 of FIG. 4 and be constructed into the global variable commands 424 of FIG. 4. FIG. 11 illustrates an exemplary set of global variable commands 900, including various global parameters 1110.

Figure 8:
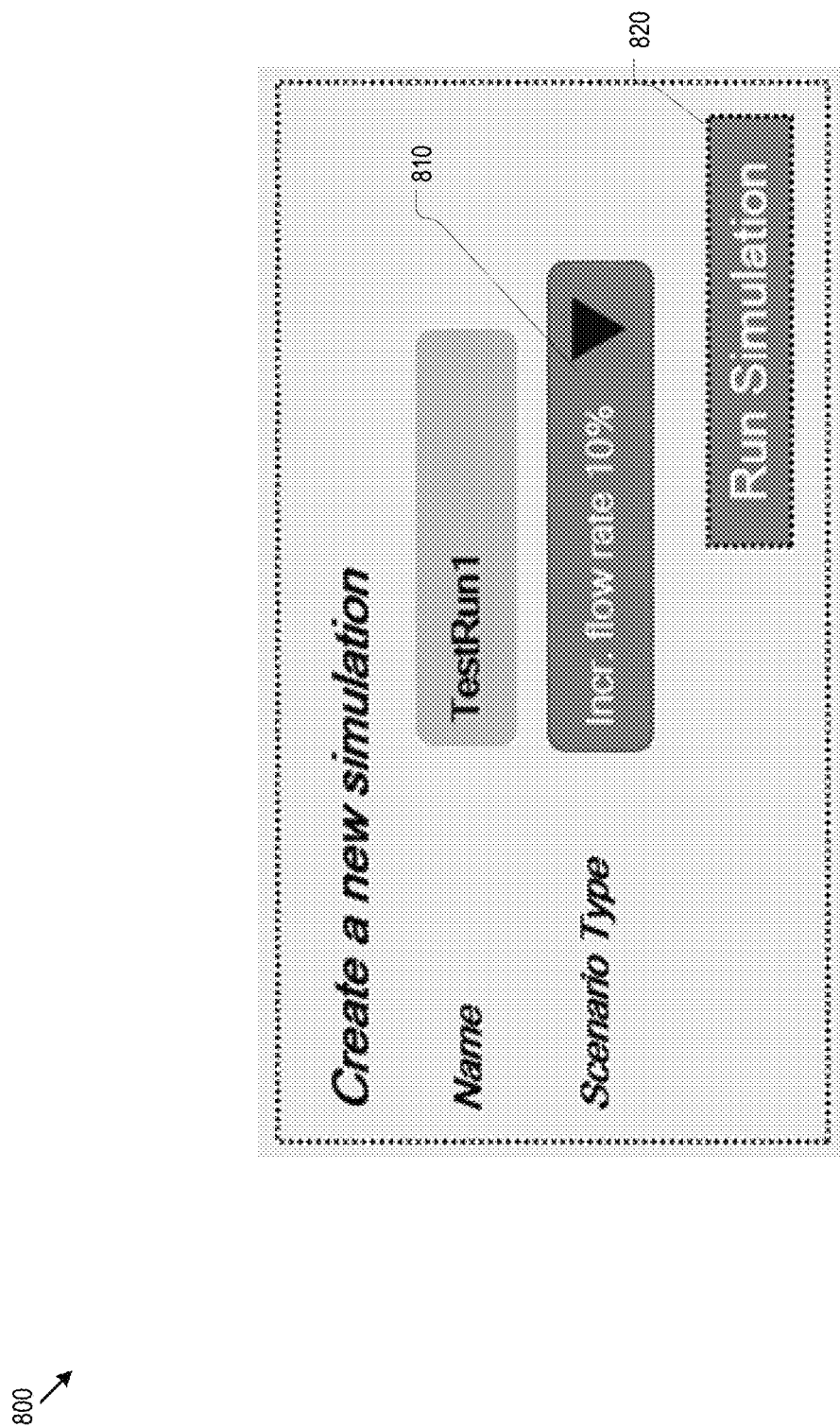
FIG. 8 illustrates an example graphical user interface for configuring execution of a digital replica or digital sibling of a multi-stage processing facility.

FIG. 8 illustrates an example of yet another user interface component 800 as part of the runtime user interface 452 of FIG. 4 for configuring the execution of the digital replica and/or digital siblings. For example, the user may choose to simulate the digital replica or any of the digital siblings by using selection/button 810. In the example shown in FIG. 8, a digital sibling of the multi-stage processing facility representing a modification of the a flow parameter may be selected and run, for example, as a what-if scenario for the operation of the multi-stage facility. Alternatively, parallel simulations including, for example, both the digital replica and one or more digital siblings may be run. One or more of the configuration settings of the user interface 800 may be processed by the digital platform to extract portion of the configuration commands in the configuration memory 410 of FIG. 4. For example, the selection of a particular simulation scenario, a what-if scenario in this example, may be extracted and included into the global variables 424 within the configuration command memory 410 of FIG. 4, as indicated by the arrow 453. Correspondingly, the global variable commands as included in 1100 of FIG. 11 may include command 1120, indicating that an intervention simulation is to be enabled and run. The execution of the selected digital replica and/or digital sibling may be initiated using button 820.

Other user interface components may be further implemented. For example, configuration for flow of material batches through the digital replica or digital siblings, including a number batches and frequency of the batches may specified. These parameters, may be further extracted by and included in, e.g., the batch commands 420 of FIG. 4.

Figure 12:
FIG. 12 illustrates an example configuration commands for configuring runtime environment and inter-digital-representation triggering signal.

The configuration information from the various user interfaces or user interface components of FIGS. 5-8 may be additionally processed and extracted by the digital platform to obtain a set of environmental/signaling commands 422 of FIG. 4. An example of such commands are shown by 1200 of FIG. 12. The environmental/signaling commands shown in 1200 may be used by the runtime manager 450 of FIG. 4 to orchestrate the simulation and prediction of the digital replica and/or digital siblings of the multi-stage processing facility. For example, commands 1210, 1220 and 1230 are interpreted by the runtime manager as including various predictive and non-predictive agents from the binary pool 430 of FIG. 4 into the simulation. Command 1250, as interpreted by the runtime manager 450, specifies the topology of the simulation and prediction based on a process agent "batches" (1252), an example of which was shown in FIG. 10. Command 1260 specifies a run time 1262 for the simulation/prediction, in units of, e.g., minutes. Command 1240 specifies a controller agent that may be responsible for prescribing control timing for running the digital representations included in the digital replica and/or digital sibling of the multi-stage processing facility. Variables for the commands may be set as particular values or functions. For example, variables for commands 1240 and 1250, as indicated by 1242 and 1254, may be specified in the form of functions. These functions, for example may contain prescription as to the timing for running each digital representations, the inter-digital-representation triggering signals/links, other triggering signals for the execution of the digital replica or digital siblings, as well as configurations for number and frequency of batches being simulated.

The various examples of configuration commands shown in FIGS. 9-12 may be organized by the configuration input manager 404 of FIG. 4 into one or more configuration files. In one implementation, the delineation of these commands into different configuration files may follow the grouping of commands as shown by 416-424 of FIG. 4. These configuration files may be maintained as, for example, spreadsheets, as shown by FIGS. 9-12. Other appropriate manners for organizing and formatting the configuration commands are also contemplated. While these files, as described above, may be generated by the configuration input manager and/or the runtime user interface automatically based on user input via the graphical configuration input user interface 402 and the runtime user interface 452, they may alternatively be created and/or editable using, e.g., any spreadsheet editing tool.

Figure 13:
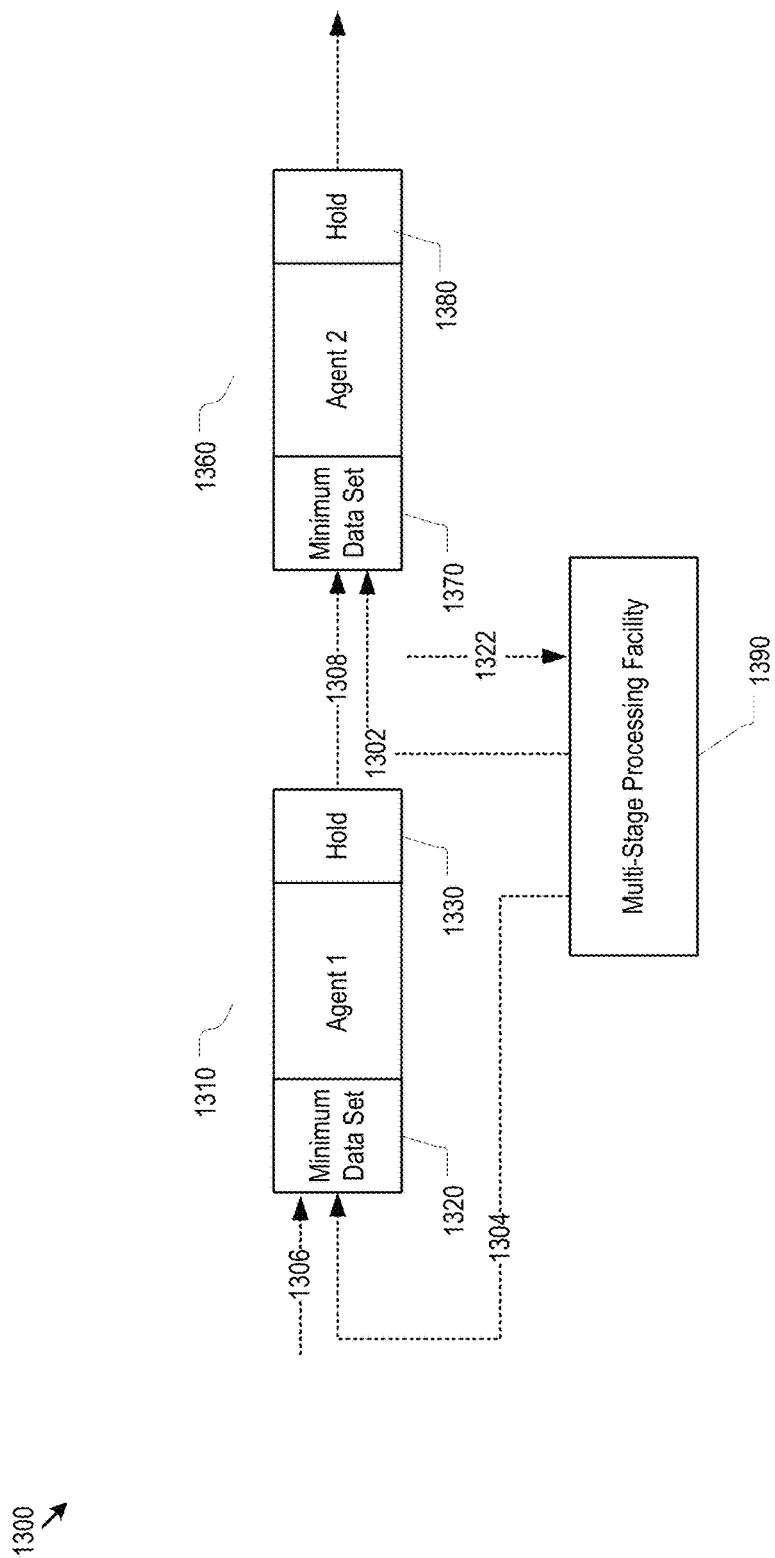
FIG. 13 illustrates an example triggering and signaling scheme for running a digital replica to digital sibling of a multi-stage processing facility.

FIG. 13 illustrates inter-digital-representation signaling and triggering that may be specified in the signaling/environmental commands 422 of FIG. 4. As shown by 1310 and 1360 of FIG. 13, execution of each digital representation or digital agent may be controlled by the runtime manager according to various triggering signals and timing commands from the configuration commands memory. For example, digital agent 1310 or 1360 may begin execution when inter-digital-representation triggering data/signal 1306 or 1308 is received by digital agent 1310 or 1360. Alternatively or additionally, digital agent 1310 or 1360 may begin execution when real-time triggering data/signal 1304 or 1302 is received from the multi-stage processing facility 1390. Alternatively or additionally, the execution of digital agent 1310 or 1360 may be triggered only when a minimum data set 1320 or 1370 is available. The minimum data set 1320 or 1370 may include the inter-digital-representation triggering data/signal 1306 or 1308, the real-time triggering data/signal 1304 or 1302 from the multi-stage processing facility, and/or other triggering data/signal. The inter-digital-representation triggering data/signal 1306 or 1308, for example, may include prediction output by the preceding agent (e.g., prediction output of agent 1310 forms part of triggering signal for agent 1360).

The real-time triggering data/signal 1302 or 1304 may include sensor data or other data/signal communicated from the multi-stage processing facility 1390, and may be updated periodically or in any other updating mode. The real-time triggering data/signal 1302 or 1304 may be communicated to the digital platform using a predetermined communication protocol, such as Open Platform Communications (OPC) protocol. These real-time triggering data/signal together with other data communicated from the multi-stage processing facility to the digital platform may be recorded and organized and become the historical data in the historical database 444 of FIG. 4, as shown by arrow 445 of FIG. 4. These historical data may become the data corpus for training predictive modes by the agent creation manager 442 according the training codes in the predictive model training code repository 446 of FIG. 4.

The running of the agents 1310 and 1360 may be synchronized with the multi-stage processing facility, particularly as part of a digital replica. The synchronization may be based on seizure and release of materials at each stage of the operation of the multi-stage processing facility. Signal indicating material seizure or release may be communicated to the digital platform from various stages or processing components of the multi-stage processing facility in, e.g., 1302 and 1304 of FIG. 13. Because computer simulation of agents 1310 and 1360 may be much faster than the actual processing of material in the corresponding physical stage of the multi-stage processing facility, agent 1310 and 1360 may be controlled to hold inter-digital-representation triggering data/signal for predetermined period of time as indicated by 1330 and 1380. The runtime control parameters and timing signal specification may be specified in the environmental/signaling commands 422 of FIG. 4 and interpreted by the runtime manager 450 when executing the digital replica or digital siblings.

In some implementation, the real-time data interface 460 of FIG. 4 between the digital platform and the multi-stage processing facility may be two ways. In particularly, in addition to communicate real-time data, e.g., sensor data, from the multi-stage processing facility to the digital platform as timing/triggering signals for the simulation or for storage into the historical database 444, the real-time data interface 460 may communicate messages from the digital platform to the multi-stage processing facility, as shown by arrow 461 of FIG. 4 and arrow 1322 of FIG. 13. The messages may contain predictive data such as predicted key performance indicators for the entire multi-stage processing facility or for particular processing components. The messages may alternatively or additionally include control data derived from the simulation for controlling one or more processing components of the multi-stage processing facility. For example, operations parameters such as flow rate, stirring rate, and the like may be automatically controlled and the other operational configuration of the multi-stage processing facility may be automatically modified based on the data contained in these messages. The multi-stage plant may further provides feedback in the form of data messages representing the outcome of the modification made. Such feedback may then be used to evaluate, e.g., effectiveness of the predictive models and be used to adjust the training codes of the predictive models.

Figure 14:
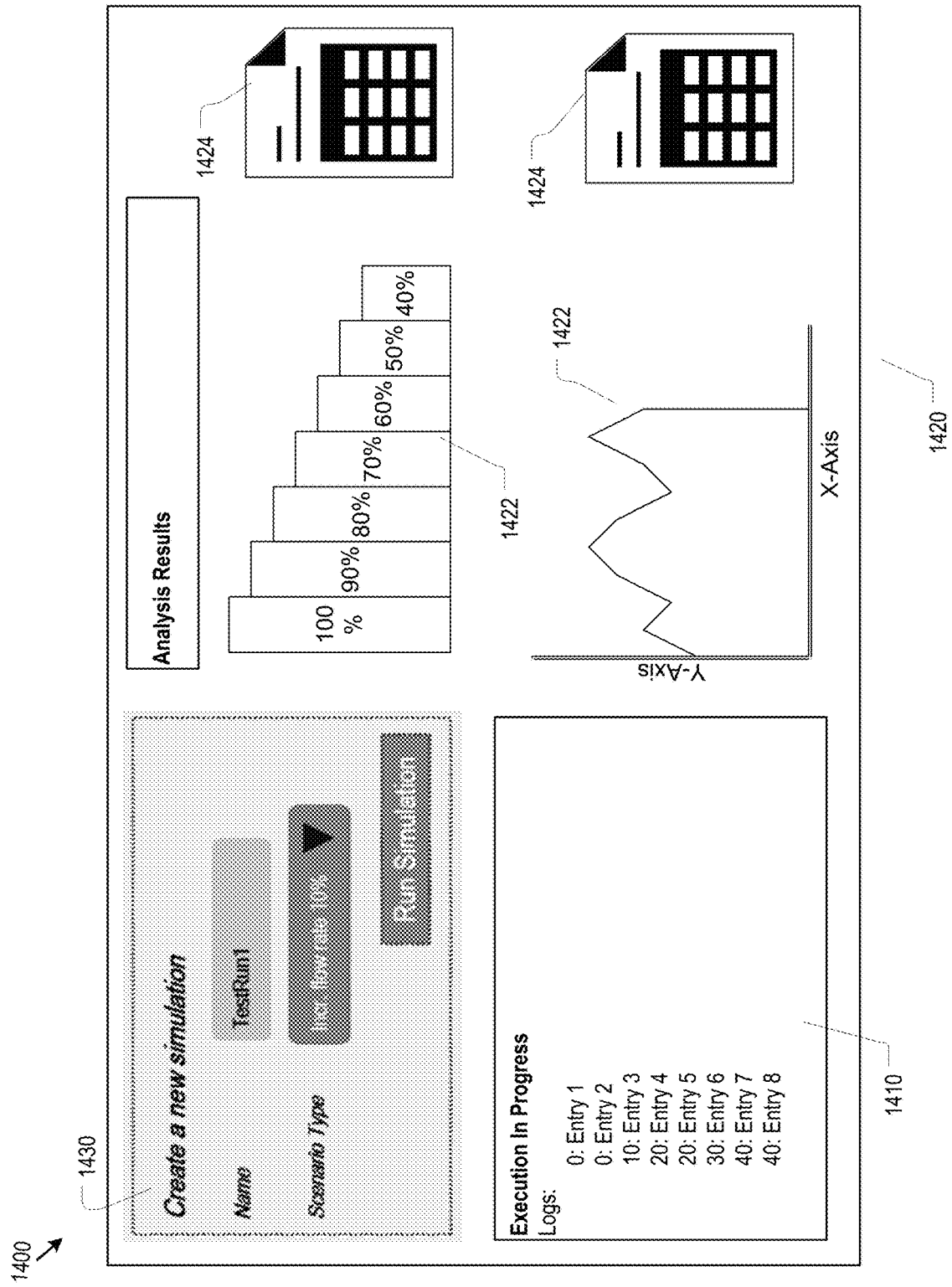
FIG. 14 illustrates an example dashboard user interface of the digital platform of FIG. 4.

FIG. 14 illustrates an exemplary dashboard user interface 470 of FIG. 4. The dashboard 1400, for example, may include a panel 1410 for displaying a log for the current simulation. The log 1410 may track the activities of the digital agents in a time sequence. Each individual log item may be generated by a digital agent according to a log command when executed. The log command may be included as part of the agent configuration commands as shown by 920 in FIG. 9. The dashboard 1400 may further include one or more panels 1420 for displaying output of the simulation, in forms of, e.g., various type of graphs 1422 and tables 1424. These output, for example, may represent key performance indicators such as throughput and various product quality measures. The runtime user interface 452 of FIG. 4 may be optionally integrated with the dashboard interface 1400, as shown by 1430. As such, a user may modify, for example, a selection of various digital siblings (such as various interventions, or what-if scenarios), and rerun the simulation in a convenient manner.

Returning to FIGS. 9-12, the various configuration commands, including the agent commands, the topology commands, the batch commands, the global variables, and the environmental/signal commands, may be designed specifically for application in a particular industry, or may be designed generally to be applicable for a variety of industries. As such, the digital platform described above may be provided as a service to a wide range of industrial settings. A user from a particular multi-stage processing facility may simply obtain a user account for the service and begin to upload training codes, and build predictive models, digital agents, digital replica and digital siblings of the multi-state processing facility for simulation and prediction. The configuration commands of FIGS. 9-12 may each include a name for the command and its parameters or variables. Table 1 below illustrates an example implementation of a set of configuration commands, specifying their type and parameters.

TABLE 1

| Command | Type | Type description | Var 1 | Var 2 | Var 3 | Var 4 | Var 5 |
|---|---|---|---|---|---|---|---|
| Log | Static | Message to be displayed is a statement | statement | | | | |
| | Dynamic | Message to be displayed is function output with or without statement | Function and statement | | | | |
| | Dynamic-assignment | Message to be displayed is function output based on a defined assigned | Name of variable to be assigned | Value assigned to variable | Function and statement | | |

TABLE 1-continued

| Command | Type | Type description | Var 1 | Var 2 | Var 3 | Var 4 | Var 5 |
|---|---|---|---|---|---|---|---|
| | | variable with or without statement | | | | | |
| Seize | Static | Name of resource and amount | Name of resource | Amount | Seize | | |
| Release | Static | Name of resource and amount | Name of resource | Amount | | | |
| Timeout | Static | Timeout is a constant value | Constant | | | | |
| | Dynamic | Timeout is a variable | Function | | | | |
| Set_attribute | Static | Attribute is a constant | Name of agent attribute | Attribute value | Local OR global | | |
| | Dynamic | Attribute is defined as a function | Name of agent attribute | Attribute function | Local OR global | | |
| branch | Dynamic | Var 1 is always a function | A function/condition that returns the number of the sub trajectory to join | Name of sub trajectory 1 to join | | | |
| Join | Static | Var 1 is in the form of text | Name of agent/non predictive agent to join | | | | |
| rollback | Static | Rollback always happens | Number of activities to roll back to | Number of times to execute these activities | | | |
| | Dynamic | Rollback happens depending on the outcome of a function | Number of activities to roll back to | Number of times to execute these activities | Function that returns TRUE if rollback is to be executed and FALSE for rollback to be ignored. | | |
| Trap | Static | Subscribes to a signal and waits | Signal | | | | |
| | Dynamic | Executes trajectory activities of another defined agent/non-predictive agent once subscribed to a signal | Signal | Name of agent/non-predictive agent to join when signal is received | Whether agent/non-predictive agent associated with signal can be interrupted (TRUE/FALSE) | | |
| Wait | Static | Waits for signal to be received | Signal | | | | |
| Untrap | Static | Unsubscribes to a signal | Signal | | | | |
| Send | Static | Signal statement is fixed | Signal | Time until signal is sent | | | |
| | Dynamic | Function defines the signal statement | Function that returns signal | Time until signal is sent | | | |
| Add_generator | Static | Interarrival time is fixed | Name of arrivals of process agent (e.g | Name of process agent | Generator start time | | |

TABLE 1-continued

| Command | Type | Type description | Var 1 | Var 2 | Var 3 | Var 4 | Var 5 |
|---|---|---|---|---|---|---|---|
| | | | units, tonnes, kg) | | | | |
| | Dynamic | Interarrival time is a function | Name of arrivals of process agent (e.g units, tonnes, kg) | Name of process agent | Function/distribution defining generator interarrival time | | |
| | Dynamic schedule | Interarrival time follows a distribution with a specified schedule | Name of arrivals of process agent (e.g, units, tonnes, kg) | Name of process agent | Start time | Stop time | Function/distribution defining generator interarrival time |
| Add_resource | Static | Capacity of resource is fixed | Name of predictive or non-predictive agent | Capacity of resource | Add_resource | Static | Capacity of resource is fixed |
| Run | Static | Time for simulation to run is fixed | Run time in minutes | | | | |

Figure 15:
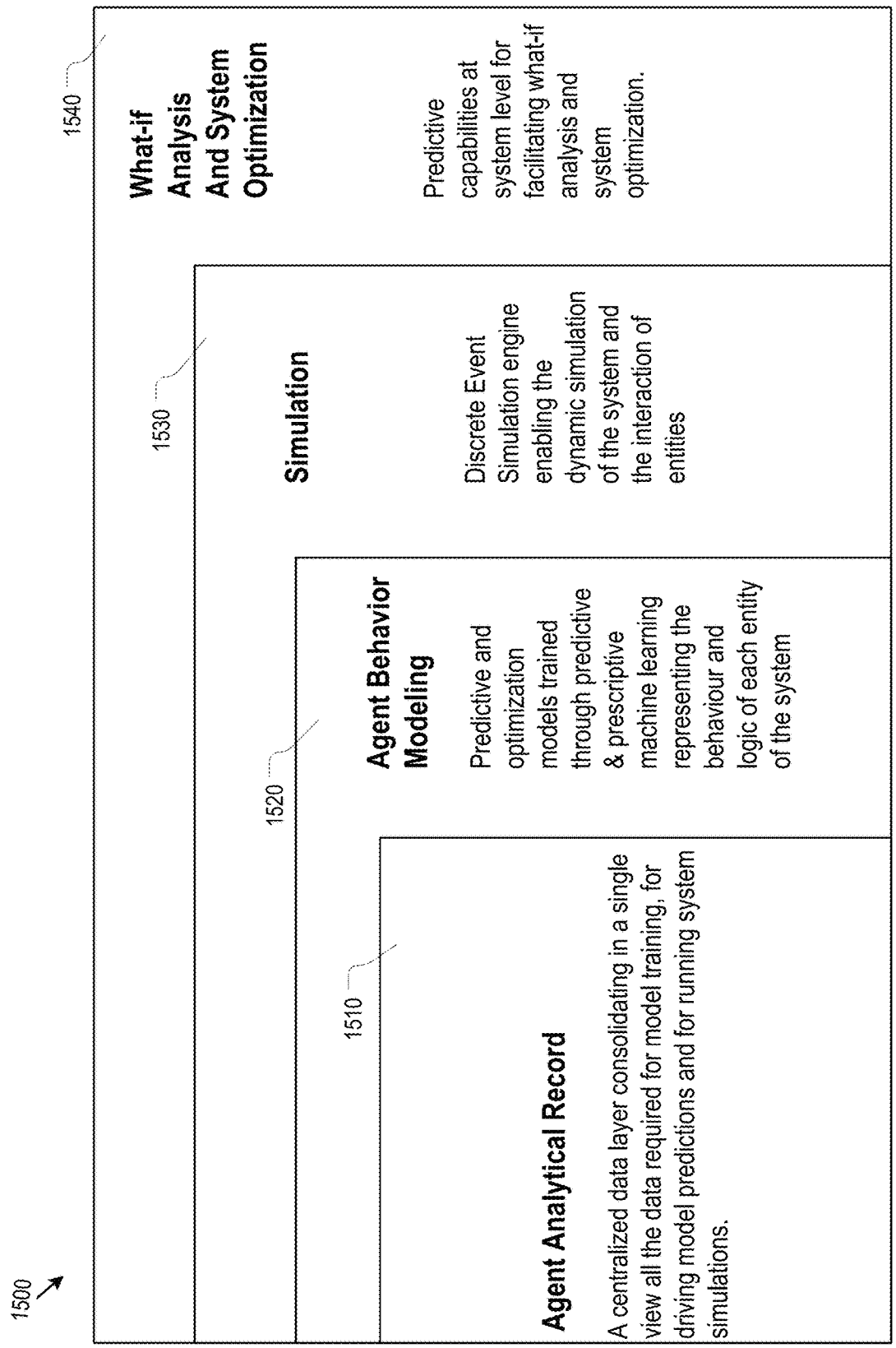
FIG. 15 illustrates an architectural implementation of the digital platform.

FIG. 15 illustrates an architectural implementation 1500 of the digital platform disclosed above. Implementation 1500 may include multiple layers, such as an agent analytical record layer 1510, an agent behavior modeling layer 1520, a simulation layer 1530, and a what-if analysis and system optimization layer 1540. As shown in FIG. 15, these layers may be implemented in a hierarchical manner. The agent analytical record layer 1510, for example, may be implemented as a centralized data layer that consolidates in a single view all the data required for model training, for driving model predictions, and for running system simulations. Layer 1510 may include, e.g., links of an agent with other agents, such as types of communications and signals to and from other agents. Layer 1510 may further include static agent attributes, such as specification about expected processing time, location, and design specification of the physical components corresponding to the digital agents. Layer 1510 may further include dynamic agent attributes such as condition attributes and temperature attributes obtained from the multi-stage processing facility, and model attributes such as expected failure probability and scheduling and planning decisions. The agent behavior modeling layer 1520 may be implemented over the agent analytical record layer 1510 to provide predictive and optimization models trained through predictive and/or prescriptive machine learning representing the behavior and logic of each entity of the system. These models, for example, may be created by running training codes and stored in the model repository as described above and in FIG. 4. The simulation layer 1530 may be implemented on top of the agent behavior modeling layer 1520 to perform discrete dynamic event simulation for the multi-stage processing facility and to perform simulation of the interactions between agents. Finally, the what-if analysis and system optimization layer 1540 may be implemented to perform predictive analysis at system level for carrying out what-if analysis and system optimization, as discussed in more detail above.

The implementations disclosed above in FIG. 3 through FIG. 7 and FIG. 15 provide improvements of computing technology and solves various technical problems in several aspects. For example, rather than training a simulative and predictive model holistically for a multi-stage processing facility, the approach described above modularize various functions and processes into discrete reusable and reconfigurable digital agents. Configurations of the internal working and interconnections of the reusable and reconfigurable digital agents are achieved by a group of configuration commands. The simulation of the entire multi-stage facility is performed in runtime by pulling in executable resources as needed. In particularly, modularized predictive models based on machine learning algorithms, historical data, and other analytical techniques are trained in runtime and as needed. The simulation may further be synchronized with the actual operation of the multi-stage processing facility. This approach is technically advantageous because i) it reduces memory requirement by avoiding training excessively large analytical models, ii) it reduces issues of over fitting by using smaller models and more targeted historical training data for each model, iii) it improves accuracy of the predictive models because it divides a large simulative problem into small chunks, iii) it improves execution efficiency by running modeling components and training analytical models as needed; and iv) it provides real-time control to various physical stages of the multi-stage processing facility through a messaging mechanism.

This approach also offer other general characteristics, including but not limited:
  Re-use of existing modes or digital agents for expanding facility.
  Ability to virtually modify configuration and predict how the modification may affect specific key performance indicators.
  Ability to learn from the performance results of past interventions and propose new configurations in order to optimize a set of key performance indicators.
  Ability to configure complex processing components to reflect their physical equivalent.
  Flexibility in updating and maintain a predictive model and associated machine learning algorithms and analytic techniques without affecting other predictive models and without affect any previously configured simulations using the predictive model.
  Testing and validation of each predictive model in a distinct environment before deployment.

Extensibility for adding features and carry-forward customizations by simultaneously maintaining different versions of similar agents.

Interoperability for connecting the simulation model to other existing platform through standard API calls.

Scalability to multiple facilities and key performance indicators.

Real-time facility monitoring.

Real-time facility control.

Broad applicability to a wide range of industries organized. internally or problem by treating rather than using one-hot binary vectors to represent various data, the implementations above uses a combination of one-hot binary vectors and numerical dense vector data structure to achieve reduced computational complexity and speedup in the training process of the deep-leaning neural network model.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

What is claimed is:

1. A digital assistant for a multi-stage processing facility, comprising:
    a communication interface circuitry for receiving real-time data from the multi-stage processing facility;
    a database for storing historical data of the multi-stage processing facility;
    a model repository for storing at least one model training code;
    a configuration memory for storing a first group of configuration commands;
    a processing circuitry in communication with the database, the model repository, and the configuration memory, the processing circuitry configured to:
        generate a set of executable digital representations each simulating material processing in one of multiple physical stages of the multi-stage processing facility by interpreting a first set of commands of the first group of configuration commands, wherein at least one of the set of executable digital representations comprises a model trained using a model training code from the model repository and the historical data;
        retrieve a second set of commands from the first group of configuration commands specifying a connection topology of the set of executable digital representations that digitally replicates the multi-stage processing facility, wherein the connection topology indicates a flow configuration of materials through the multiple physical stages;
        retrieve a third set of commands from the first group of configuration commands that further specify a flow of batches of materials through the set of executable digital representations;
        retrieve a fourth set of commands from the first group of configuration commands in the configuration memory that specify inter-digital-representation triggering or linking signals;
        load and execute the set of executable digital representations in a time sequence according to the flow of batches of materials through the connection topology of the set of executable digital representations and according to the inter-digital-representation triggering or linking signals, wherein the inter-digital-representation triggering or linking signals comprise at least signals for seizure and release of materials to control execution from one digital representation to another and to synchronize the flow of batches of materials between the executable digital representations and the multiple physical stages of the multi-stage processing facility; and
        generate a graphic display of a predicted key performance indicator output from the execution of the set of executable digital representations,
        wherein the first group of configuration commands are entered in a mixed form at least in that the first set of commands are entered as one or more textual spreadsheet and that the second set of commands are entered graphically and topologically.

2. The digital assistant of claim 1, wherein the processing circuitry is further configured to:
    provide a graphical user interface for uploading the at least one model training code; and
    store the at least one model training code in the model repository.

3. The digital assistant of claim 1, wherein the real-time data and historical data comprise measurement data taken by sensors distributed in the multi-stage processing facility.

4. The digital assistant of claim 1, wherein at least two of the set of executable digital representations comprise a predictive model trained based on identical predictive model training code.

5. The digital assistant of claim 1, wherein the processing circuitry is further configured to:
provide a graphical user interface comprising:
a first graphical user interface component for obtaining a selection of attributes for establishing a library of executable digital representations; and
a second graphical user interface component for graphically obtaining a first selection and a first arrangement of the set of executable digital representations from the library of executable digital representations;
generate the first group of configuration commands according to the selection and the first arrangement of the set of executable digital representations in the second graphical user interface component and the selection of attributes in the first graphical user interface component; and
store the first group of configuration commands in the configuration memory.

6. The digital assistant of claim 5, wherein the processing circuitry is further configured to:
provide a third graphical user interface component for graphically obtaining a second arrangement of the set of executable digital representations;
generate a second group of configuration commands according at least the second arrangement of the set of executable digital representations representing a modified multi-stage processing facility; and
provide a selectable option in the graphical user interface to execute the set of executable digital representations by interpreting either the first group of configuration commands or the second group of configuration commands.

7. The digital assistant of claim 1, wherein the second set of commands from the first group of configuration commands further specify real-time data or triggering signal communicated from the multi-stage processing facility to the set of executable digital representations, and wherein the processing circuitry is configured to load and execute the set of executable digital representations in the time sequence according to the real-time data or triggering signal communicated from the multi-stage processing facility in addition to according to the flow of batches of materials through the connection topology of the set of executable digital representations and according to the inter-digital-representation triggering or linking signals.

8. The digital assistant of claim 7, wherein the real-time data or triggering signal communicated from the multi-stage processing facility are generated by sensors distributed in the multi-stage processing facility.

9. The digital assistant of claim 7, wherein the processing circuitry is configured to receive the real-time data or triggering signal from the multi-stage processing facility using a predetermined communication message protocol.

10. The digital assistant of claim 1, wherein at least one of the inter-digital-representation triggering or linking signals comprise a predicted characteristics of the flow of batches of materials generated by one digital representation and inputted to a next digital representation connected according to the connection topology.

11. The digital assistant of claim 1, wherein the processing circuitry is further configured to communicate control messages generated based on the predicted key performance indicator to the multi-stage processing facility using a predetermined communication protocol.

12. The digital assistant of claim 1, wherein the set of executable digital representations comprises predictive digital representations and non-predictive digital representations.

13. The digital assistant of claim 1, wherein each of the set of executable digital representations comprises at least one log function specified in the first set of commands of the first group of configuration commands for generating timestamped log messages when executed, and wherein the processing circuitry is further configured to provide a log display panel for tracking activities of the set of executable digital representations being executed by displaying the timestamped log messages.

14. A method implemented by a digital assistant for a multi-stage processing facility including a communication interface circuitry for receiving real-time data from the multi-stage processing facility, a database for storing historical data of the multi-stage processing facility, a model repository for storing at least one model training code, a configuration memory for storing a first group of configuration commands, and a processing circuitry in communication with the database, the model repository, and the configuration memory, the method comprising:
generating a set of executable digital representations each simulating material processing in one of multiple physical stages of the multi-stage processing facility by interpreting a first set of commands of the first group of configuration commands, wherein at least one of the set of executable digital representations comprises a model trained using a model training code from the model repository and the historical data;
retrieving a second set of commands from the first group of configuration commands specifying a connection topology of the set of executable digital representations that digitally replicates the multi-stage processing facility, wherein the connection topology indicates a flow configuration of materials through the multiple physical stages;
retrieving a third set of commands from the first group of configuration commands that further specify a flow of batches of materials through the set of executable digital representations;
retrieving a fourth set of commands from the first group of configuration commands in the configuration memory that specify inter-digital-representation triggering or linking signals;
loading and execute the set of executable digital representations in a time sequence according to the flow of batches of materials through the connection topology of the set of executable digital representations and according to the inter-digital-representation triggering or linking signals, wherein the inter-digital-representation triggering or linking signals comprise at least signals for seizure and release of materials to control execution from one digital representation to another and to synchronize the flow of batches of materials between the executable digital representations and the multiple physical stages of the multi-stage processing facility; and
generating a graphic display of a predicted key performance indicator output from the execution of the set of executable digital representations,
wherein the first group of configuration commands are entered in a mixed form at least in that the first set of commands are entered as one or more textual spreadsheet and that the second set of commands are entered graphically and topologically.

15. The method of claim 14, further comprising:
providing a graphical user interface for uploading the at least one model training code; and
storing the at least one model training code in the model repository.

16. The method of claim 14, wherein the real-time data and historical data comprise measurement data taken by sensors distributed in the multi-stage processing facility.

17. The method of claim 14, wherein at least two of the set of executable digital representations comprise a predictive model trained based on identical predictive model training code.

18. The method of claim 14, further comprising:
providing a graphical user interface comprising:
   a first graphical user interface component for obtaining a selection of attributes for establishing a library of executable digital representations; and
   a second graphical user interface component for graphically obtaining a first selection and a first arrangement of the set of executable digital representations from the library of executable digital representations;
generating the first group of configuration commands according to the selection and the first arrangement of the set of executable digital representations in the second graphical user interface component and the selection of attributes in the first graphical user interface component; and
storing the first group of configuration commands in the configuration memory.

19. The method of claim 18, further comprising:
providing a third graphical user interface component for graphically obtaining a second arrangement of the set of executable digital representations;
generating a second group of configuration commands according at least the second arrangement of the set of executable digital representations representing a modified multi-stage processing facility; and
providing a selectable option in the graphical user interface to execute the set of executable digital representations by interpreting either the first group of configuration commands or the second group of configuration commands.

* * * * *